United States Patent [19]

Corleto et al.

[11] Patent Number: 5,001,661
[45] Date of Patent: Mar. 19, 1991

[54] DATA PROCESSOR WITH COMBINED ADAPTIVE LMS AND GENERAL MULTIPLICATION FUNCTIONS

[75] Inventors: Jose G. Corleto; Tim A. Williams, both of Austin, Tex.

[73] Assignee: Motorola, Inc., Schaumburg, Ill.

[21] Appl. No.: 468,481

[22] Filed: Jan. 23, 1990

[51] Int. Cl.⁵ .......................... G06F 15/31; G06F 7/52
[52] U.S. Cl. ......................... 364/724.19; 364/724.12; 364/754
[58] Field of Search ..................... 364/724.01, 724.19, 364/736, 754, 758, 750.5, 728.01, 724.12, 724.13

[56] References Cited

U.S. PATENT DOCUMENTS

| | | | |
|---|---|---|---|
| 4,025,769 | 5/1977 | Simpson et al. | 364/728.01 |
| 4,121,296 | 10/1978 | Snijders et al. | 364/750.5 |
| 4,597,053 | 6/1986 | Chamberlin | 364/750.5 |
| 4,752,903 | 6/1988 | Iwata et al. | 364/724.19 |
| 4,754,419 | 6/1988 | Iwata | 364/724.19 |
| 4,907,182 | 3/1990 | Giuliano et al. | 364/728.01 |

Primary Examiner—Gary V. Harkcom
Assistant Examiner—Long T. Nguyen
Attorney, Agent, or Firm—Robert L. King

[57] ABSTRACT

A data processing system uses the same structure and hardware to implement either a general purpose multiplier or arithmetic operations associated with the least-mean-squares (LMS) algorithm. Multiplier and adder circuits are time-shared to perform the myriad functions. In one form, further modified Booth's algorithm is utilized so that an output product of two binary input numbers may be quickly formed by executing a series of multiplications and accumulations. The operation is pipelined for continuous processing activity.

7 Claims, 5 Drawing Sheets

$$X = 1\ 0101\ 0011\ 1001 = -2759_{10}$$

$$Y = 0010\ 0011\ 0111 = 567_{10}$$

$$X*Y = \$E\ 8\ 2\ 1\ 3\ F = -1564353_{10}$$

$$X = 1\ 0101\ 0011\ 1001$$

$$-X = 0\ 1010\ 1100\ 0111$$

PARTIAL
PRODUCT = 0000 0000 0000 0000 0000 0000

CYCLE A

```
                    0 1010 1100 0111   Y[2:-1]=1110= -X
                 0101 0110 0011 1      Y[5:2]=1101= -X
```
PARTIAL
PRODUCT = 0000 0000 0110 0000 1111 1111

CYCLE B

```
              101 0100 1110 01         Y[8:5]=0001= +X
           10 1010 0111 001            Y[11:8]=0010= +X
```
PARTIAL  1110 1000 0010 0001 0011 1111
PRODUCT=   E    8    2    1    3    F

| CLOCK CYCLE | PHASE | OPERATION | RECODER 92 | MULTIPLIER 87 INPUT A | ADDER 96 INPUT A | ADDER 96 INPUT B | RECODER 93 | MULTIPLIER 106 INPUT A | ADDER 110 INPUT A | ADDER 110 INPUT B | C4 | C5 | C6 | C7 | C8 | C9 | RESET |
|---|---|---|---|---|---|---|---|---|---|---|---|---|---|---|---|---|---|
| 1 | ø1 | ADDER 96 → NO OPERATION |  |  |  |  |  |  |  |  |  |  | A | A | B |  |  |
|  | ø2 | MULTIPLIER 87 → LATCH 88=Y[2:-1]*X; ADDER 110 → NO OPERATION; MULTIPLIER 106 → LATCH 108=Y[5:2]*XSHIFT | Y[2:-1] | X |  |  | Y[5:2] | X SHIFTED LEFT BY 3 BITS |  |  | C |  |  |  | A | ASSERT | ASSERT |

TO FIG.3B

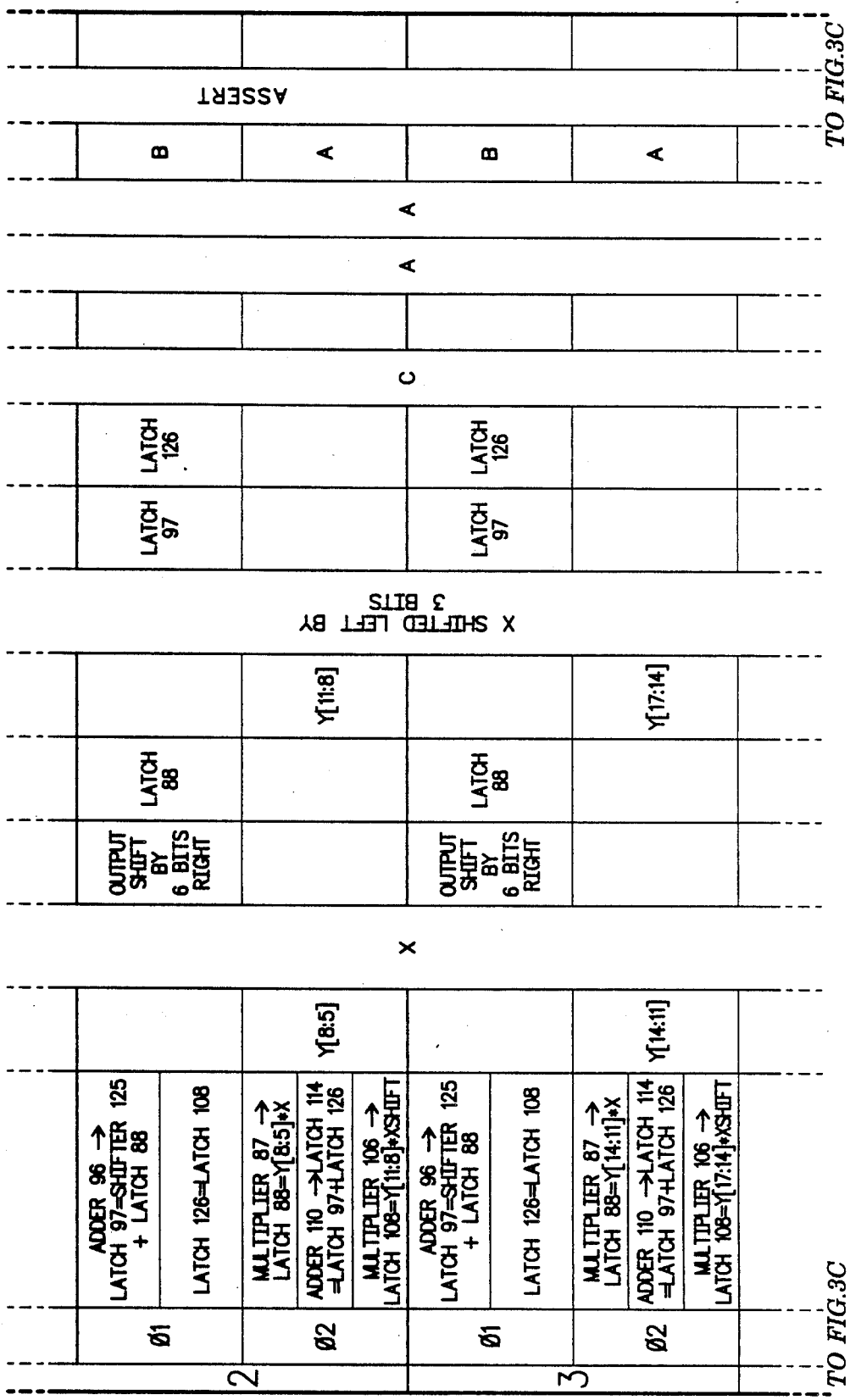

DATA PROCESSOR WITH COMBINED ADAPTIVE LMS AND GENERAL MULTIPLICATION FUNCTIONS

CROSS REFERENCE TO RELATED APPLICATION

U.S. Pat. No. 4,947,363 entitled "A Pipelined Processor For Implementing The Least-Mean-Squares Algorithm" filed by Tim Williams and assigned to the assignee hereof.

TECHNICAL FIELD

This invention relates to data processors, and more particularly, to data processors operating in adaptive systems.

BACKGROUND OF THE INVENTION

In an adaptive, time varying system a predetermined impulse function used for excitation changes at every data sample point or set of data samples. Such a system is therefore nonlinear. A digital filter is directed to a particular transfer function by an adaption processor depending upon a desired function of the filter. An application of a digital filter is to achieve the minimum mean square error when filtering a set of data with a predetermined transfer function. This function is known as the least-mean-squares (LMS) algorithm. The error represents an error between some desired goal and what the filter is actually computing and is a measurement of the misadjustment of the filter. The LMS algorithm involves: (1) an adaption computation which is an update of coefficients in the filter based in part upon the previous error; (2) a convolution computation which is an accumulation of the product of predetermined coefficient values and data values; and (3) an error calculation.

One application of the LMS algorithm is within the implementation of a telecommunications U-interface transceiver as defined by the American National Standards Institute (ANSI) for a U-interface reference model. This interface is the twisted pair of wires which link a central office location and a subscriber in a communications system. The ANSI standard specifies a coding scheme, a data transmission rate, an echo cancellation technique and startup and synchronization procedures at both a network termination and a line termination. The LMS algorithm may be used to implement a variety of functions including: (1) a linear echo canceller (LEC); (2) a decision feedback equalizer (DFE); and (3) adaptive reference compensation. In addition, a general purpose multiplier is needed to implement a U-interface transceiver.

Others have developed a data processor for ISDN U-interface transceivers which conform to the ANSI standard. As an example, Koh et al. in an article entitled "Algorithms and Architecture of a VLSI Signal Processor For ANSI Standard ISDN Transceiver" in the IEEE *International Conference of Acoustics, Speech and Signal Processing Proceedings*, 1989, pages 2468-2471, a processor which implements a U-interface transceiver is shown. A plurality of individual arithmetic unit circuits is typically required to implement each of the functions of the linear echo canceller and decision feedback equalizer and separate circuitry is required to implement a general purpose multiplier. Similar subject matter is also discussed by Khorramabadi et al. in a paper entitled "An ANSI Standard ISDN Transceiver Chip Set" in the IEEE *International Solid-State Circuits Conference*, 1989, pages 256-257. Another example of a processor which implements the ISDN interface defined by ANSI is described by Agazzi et al. in a paper entitled "A Digital Signal Processor for an ANSI Standard ISDN Transceiver" in the IEEE *Journal of Solid-State Circuits*, Vol. 24, No. 6, Deccember 1989. A large amount of individual arithmetic processing units are typically required to implement each of the distinct functions required by the ANSI standard at the U-interface.

SUMMARY OF THE INVENTION

Accordingly, it is an object of the present invention to provide an improved data processor with combined adaptive LMS and general multiplication functions.

Another object of the present invention is to provide an improved multiple purpose data processor and method of use which minimizes circuitry.

In carrying out the above and other objects of the present invention, there is provided, in one form, a data processing system using time multiplexed circuitry to combine digital filtering and general multiplication functions with the same circuitry. The digital filtering includes implementing a predetermined algorithm in an N-tap filter, where N is an integer. A convolution of a series of data values and coefficient values for the N taps is calculated while an adaption calculation of the series of coefficient values is performed by updating the coefficient value for each tap of the filter. The general multiplication includes multiplying first and second input operands. An update portion has a first multiplier and a first adder for performing a predetermined number of update calculations to the coefficient values required to implement the predetermined algorithm. The update portion also selectively provides a first plurality of recorded operands associated with the general multiplication at an output of the first multiplier and provides partial products at an output of the first adder. A convolution portion comprises a second multiplier and a second adder coupled to the update portion. The convolution portion sums a predetermined number of convolution products, each formed by multiplying a predetermined coefficient value and a predetermined data value to provide an output signal which represents the convolution. The second multiplier also selectively provides a second plurality of recoded operands associated with the general multiplication at an output of the second multiplier and provides partial products at an output of the second adder. The second adder selectively provides an output product of the general multiplication. A storage device is coupled to both the update portion and convolution portion for selectively providing both the data values and the coefficient values required by both the update portion and convolution portion to implement the predetermined algorithm.

These and other objects, features, and advantages, will be more clearly understood from the following detailed description taken in conjunction with the accompanying drawings.

BRIEF DESCRIPTION OF THE DRAWINGS

FIG. 2 illustrates in table form a two cycle recoded multiplication of two binary numbers with the processor of FIG. 1; and FIGS. 3A, 3B and 3C in combination illustrate in graphical chart form the pipelined operation of the processor of the present invention wherein FIG. 3B is placed above FIG. 3C as noted and FIG. 3A is placed above FIG. 3B as noted.

DETAILED DESCRIPTION OF THE INVENTION

Figure 1:
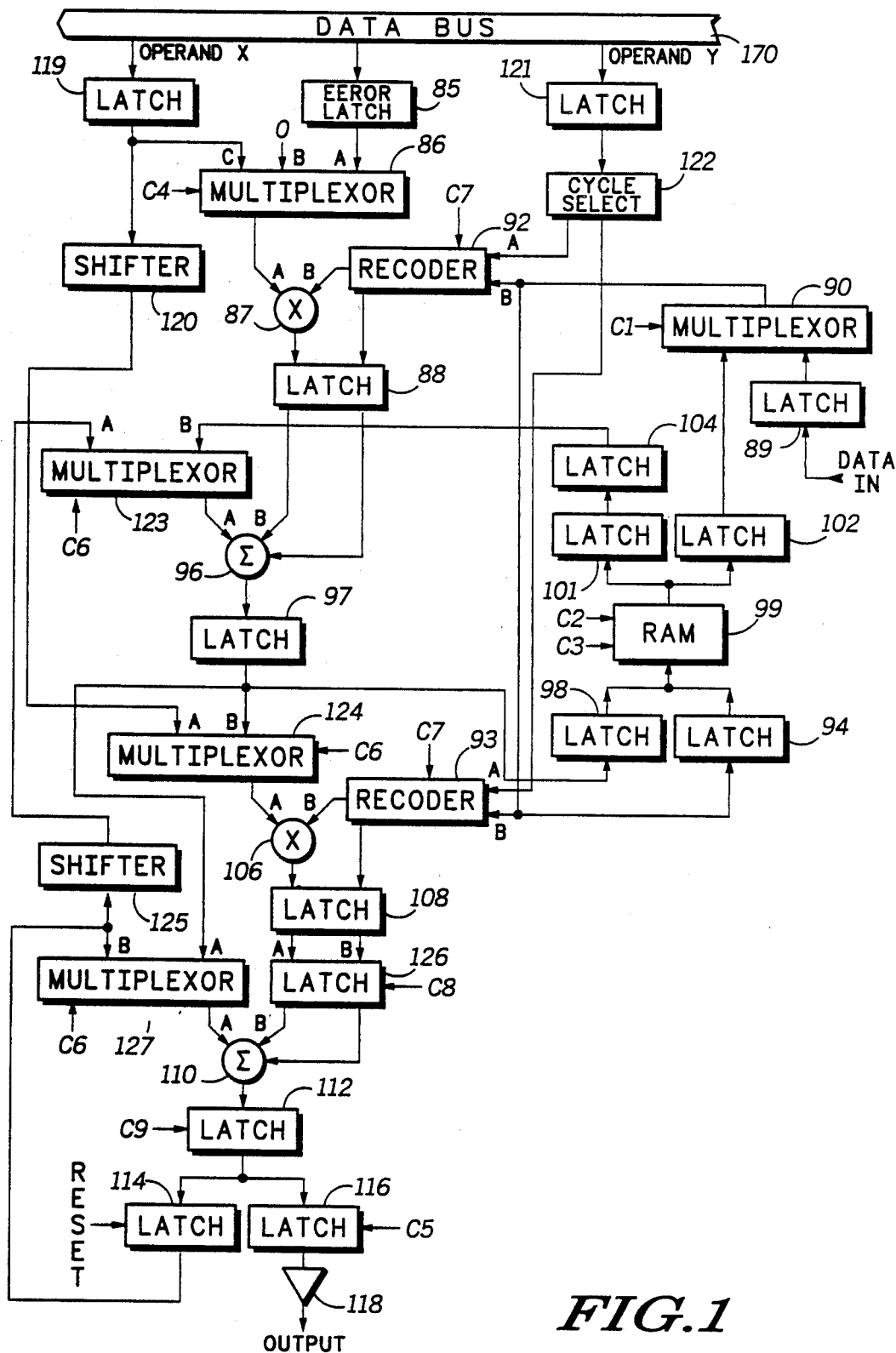
FIG. 1 illustrates in block diagram form a data processor in accordance with the present invention.

Shown in FIG. 1 is a data processor 10 which may both function to implement adaptive filter functions such as those required by a U-interface transceiver in accordance with the ANSI standard and to implement a general purpose recoded two's complement multiplier also required to implement the U-interface transceiver. Data processor 10 has many structural features in common with the data processor taught in FIG. 5 of Tim Williams' copending patent application U.S. Ser. No. 07/283,101 entitled "A Pipelined Processor For Implementing The Least-Mean-Squares Algorithm" which is herein incorporated by reference. Data processor 10 of the present invention implements the same functions as previously discussed in addition to the function of a general purpose multiplier. Therefore, for purposes of comparison, common elements between FIG. 1 herein and the processor of FIG. 5 of U.S. Ser. No. 07/283,101 are similarly numbered. Accordingly, a detailed description of the interconnections of those structural elements will not be repeated herein. It should be well understood that the filtering operation of data processor 10 involving convolution and update operations is the same as described in the incorporated copending application.

Additionally, a latch 119 for receiving an operand labeled "Operand X" is connected to a data bus 170. An output of latch 119 is connected to an input of a data shifter 120 and to an input labeled "C" of multiplexor 86. Multiplexor 86 also has an input labeled "B" for receiving a zero value and an input labeled "A" connected to the latch 85. The "A" and "B" inputs of multiplexor 86 are used exclusively in the filter operation described in the incorporated copending application. A latch 121 for receiving an operand labeled "Operand Y" is connected to data bus 170. An output of latch 121 is connected to an input of a cycle select circuit 122. A first multi-bit output of cycle select circuit 122 is connected to an input labeled "A" of recorder 92. A second multi-bit output of cycle select circuit 122 is connected to an input also labeled "A" of recorder 93. A multiplexor 123 has first and second inputs respectively labeled "A" and "B" and an output connected to a first input labeled "A" of adder 96. A second input of adder 96 which is connected to an output of latch 88 is labeled "B". A multiplexor 124 has a first input labeled "A" connected to an output of shifter 120 and has a second input labeled "B" connected to the output of latch 97. A shifter 125 has an input connected to the output of latch 114 and an output connected to the first input of multiplexor 123. An output of latch 104 is connected to the second input of multiplexor 123. A latch 126 has first and second inputs respectively labeled "A" and "B" connected to first and second outputs of latch 108. A first output of latch 126 is connected to an input labeled "B" of adder 110, and a second output of latch 126 is connected to a control input of adder 110. A multiplexor 127 has a first input labeled "A" connected to the output of latch 97 and has a second input labeled "B" connected to the output of latch 114. An output of multiplexor 127 is connected to an input labeled "A" of adder 110. A control signal C4 is connected to a control input of multiplexor 86, and a control signal C5 is connected to a control input of latch 116. A control signal C6 is connected to a control input of each of multiplexors 123, 124 and 127, and a control signal C7 is connected to a control input of each of recoders 92 and 93. A control signal C8 is connected to a control input of latch 126, and a control signal C9 is connected to a control input of latch 112. A Reset signal is connected to a control input of latch 114.

In operation, data processor 10 may alternately function as a general purpose recoded two's complement multiplier in addition to the filtering functions detailed in the incorporated pending application Ser. No. 07/283,101. To perform a multiplication of two numbers, data processor 10 again functions in a pipelined manner. As an example of the mathematical operations which are performed when two numbers are multiplied, FIG. 2 illustrates how a product is mathematically formed. It should be well understood that any plurality of cycles may be required to complete a multiplication operation depending upon the size of input operands and recoding technique. For purposes of a fundamental illustration of the multiplication operations, only two cycles are shown in FIG. 2. FIG. 3 will subsequently illustrate how these mathematical operations are efficiently implemented in a hardware data processor.

Shown in FIG. 2 is a multiplication operation of two binary numbers X and Y each having an arbitrary number of bits. For purposes of discussion, the further Modified Booth's recoding algorithm is utilized wherein further Modified Booth's algorithm is defined as the recoding of groups of four bits of an input operand to reduce partial product accumulations in a multiplication operation. In this context, Modified Booth's algorithm is defined as the recoding of groups of three bits of an input operand and Booth's algorithm is defined as the recoding of groups of two bits of an input operand. It should be well understood that other recoding algorithms may also be utilized in connection with the present invention. As shown in FIG. 2, when operands X and Y having the illustrated values are multiplied, an integer hexadecimal result of E8213F should result. Although operand Y has twelve bits and operand X has thirteen bits, any bit size may be accommodated by data processor 10. A product contains a number of bits equal to the sum of the number of bits of each operand minus one.

In the illustrated form, the product may be formed in two steps or cycles labeled "A" and "B". Initially, a reset or zeroed partial product operand is created. To provide the final product, groups of four bits each of operand Y are recoded into one of the values: (1) $\pm 4X$; (2) $\pm 3X$; (3) $\pm 2X$; or (4) $\pm X$. In the example provided herein, only the values of $+X$ and $-X$ are required. Initially, bits labeled $(-1)$ thru 2 of operand Y are recoded. The minus one bit of operand Y is a binary zero which is added to the right of the three right-most bits of operand Y. Therefore, in the example shown the bits "Y[2:−1]" are "1110". The bits are respectively weighted from left to right as "−4", "+2", "+1" and "+1". Therefore, the value "1110" recodes to $[(-4)+(+2)+(+1)+(+0)]$ or $(-1)X$. A second group of four bits of operand Y[5:2] are similarly recoded wherein one bit is overlapped with the previously recoded four bits of operand Y. In the illustrated example, this group of bits also recodes to $(-X)$. A shift to the left of three bits of this recoded operand value is made before the two recoded operands are added to provide a partial product shown at the completion of cycle A.

During cycle B, two more four-bit groups of operand Y are recoded. Namely, bits five thru eight which recode to +X and bits eight thru eleven which also recode to +X. Each recoded X operand is shifted to the left by three bit positions from the previous recoded operand. An accumulation of the previous partial product with the two newly formed recoded values is made to provide another partial product at the end of cycle B. Since operand Y was only twelve bits wide, the multiplication is completed after two cycles. It can be readily verified that the computed final partial product value is equivalent to E8213F. The operation described herein is in accordance with the conventional further modified Booth's algorithm.

Shown in FIGS. 3A and 3B is the operation of a similar multiplication operation by data processor 10 in accordance with the present invention. The operation is pipelined and may be done by the same hardware which is capable of implementing functions required by the ANSI standard to implement a U-interface transceiver. In the illustrated form, a twenty-four bit value for operand Y is shown. For this size of operand, four clock cycles each having two clock phases are required to complete a recoding operation and provide a final output product. Initially, an operand X and an operand Y are coupled by data bus 170 to data processor 10. Operand X is stored in latch 119 and shifted left by three bit positions by shifter 120 before being connected to inputs A of each of multiplexor 124 and adder 106. Operand Y is stored in latch 121 and connected to cycle select circuit 122 which couples the appropriate four bits of operand Y into recoders 92 and 93. During phase one of clock cycle one, operand X is connected to input A of multiplier 87 in response to control signal C4. Also, operand X which is shifted to the left by three bits is connected to input A of multiplier 106 in response to control signal C6. Control signal C7 allows recoders 92 and 93 to function to recode four bits of operand Y.

During phase two of clock cycle one, multiplier 87 multiplies the recoded four bits of operand Y by the operand X and stores the result in latch 88. Multiplier 106 multiplies another four bits, (5-2), of operand Y by operand X shifted three bits to the left to compute a recoded operand value (i.e. either ±4X, ±3X, ±2X or ±X) and stores the result in latch 108. Adder 110 does not operate during this cycle. The control signals required to implement this operation are shown in FIG. 3A.

During phase one of clock cycle two, adder 96 functions to add the contents of shifter 125 initially representing a reset or zeroed partial product and the contents of latch 88. The sum is stored in latch 97 at the conclusion of phase one. Concurrently, the contents of latch 108 are stored in latch 126. The control signals required to implement this operation are also shown in FIG. 3A.

During phase two of clock cycle two, multiplier 87 forms a product from another four-bit group of bits of operand Y and operand X and stores the product in latch 88. Adder 110 adds the contents of latch 97 and latch 126 and stores the contents in latch 114. Multiplier 106 concurrently multiplies another four-bit group of bits, (11-8), of operand Y and operand X shifted left by three bit positions to compute a recoded operand value (i.e. either ±4X, ±3X, ±2X or ±X). The output of multiplier 106 is stored in latch 108. The control signals required to implement this operation are also shown in FIG. 3A.

During phase one of clock cycle three, adder 96 adds the output of latch 114 shifted to the right by six bits thru shifter 125 and the contents of latch 88. The sum is stored in latch 97. Latch 126 is also loaded with the contents of latch 108. The control signals required to implement this operation are shown in FIG. 3B.

During phase two of clock cycle three, multiplier 87 forms a product by multiplying another group of four bits, (11-14), of operand Y and operand X. Concurrently, adder 110 adds the contents of latch 97 coupled via multiplexor 127 with the A contents of latch 126 representing a previous product formed by multiplier 106. Also, multiplier 106 is forming a new product for storage in latch 108 by multiplying another group of four bits, (17-14), of operand Y and the X operand shifted left by three bit positions to compute ±4X, ±3X, ±2X or ±X. The control signals required to implement this operation are also shown in FIG. 3B.

Figure 3C:
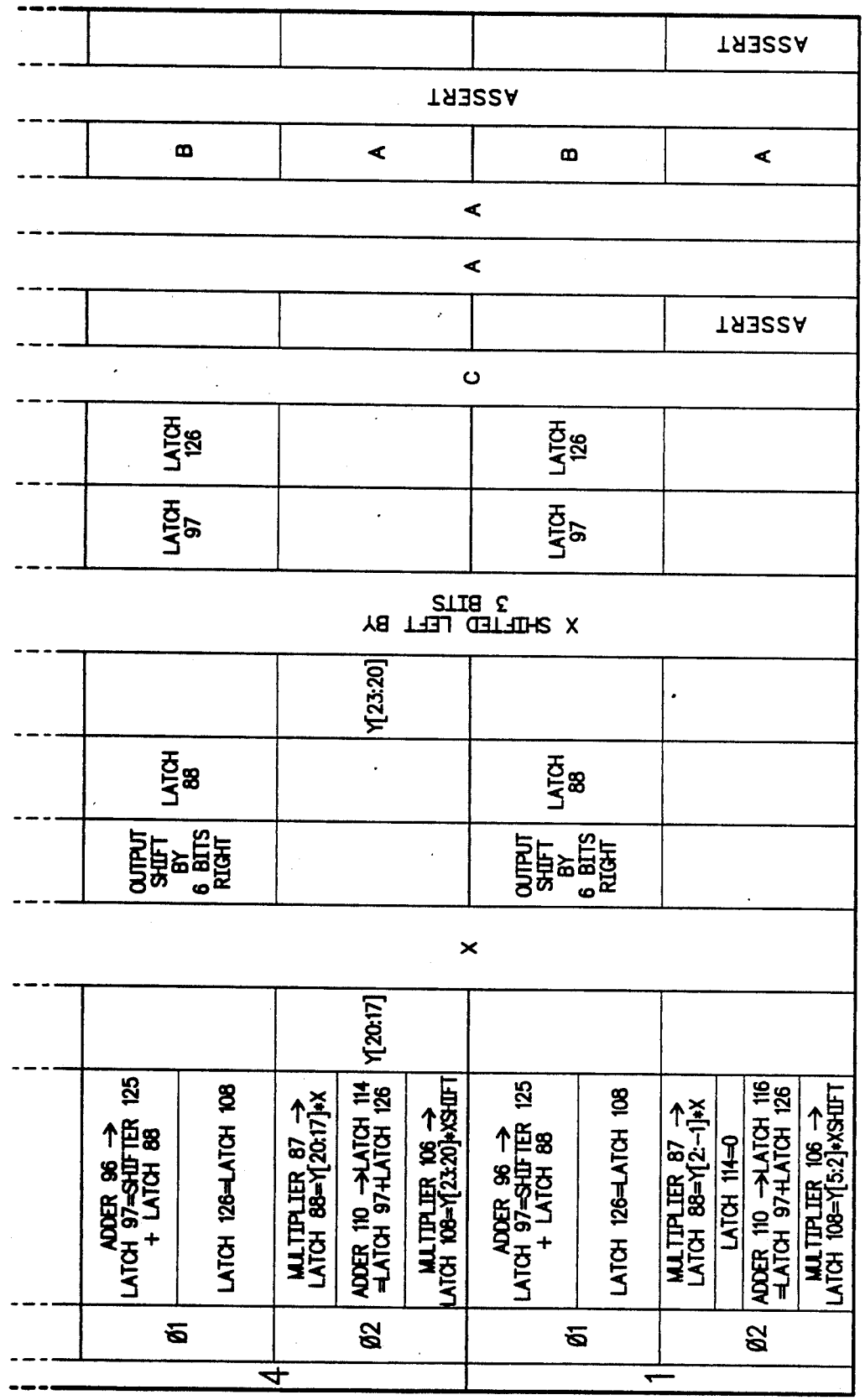

During phase one of clock cycle four, adder 96 adds the contents of shifter 125 and the contents of latch 88. The contents of shifter 125 is the previous partial product output shifted by six bits to the right. The contents of latch 88 is the previous output of multiplier 87 formed during the second clock phase of cycle three. Concurrently, the contents of latch 108 are transferred to latch 126. Latch 108 contains the product computed by multiplier 106 during the second clock phase of cycle three. The control signals required to implement this operation are also shown in FIG. 3C.

During phase two of clock cycle four, multiplier 87 forms a product by multiplying another group of four bits, (20-17), of operand Y and operand X. Concurrently, adder 110 adds the contents of latch 97 coupled via multiplexor 127 with the A contents of latch 126 representing a previous product formed by multiplier 106. Also, multiplier 106 is forming a new product for storage in latch 108 by multiplying the last group of four bits, (23-20), of operand Y and the X operand shifted left by three bit positions to implement ±4X, ±3X, ±2X or ±X. The control signals required to implement this operation are also shown in FIG. 3B.

At this point in the described operation, data processor 10 is now ready to begin a new multiplication operation while a final partial product accumulation associated with the first multiplication operation is being completed. Therefore, data processor 10 functions in a pipelined manner as previously described for a filtering operation. During a first phase of a repeat clock cycle one, adder 96 functions to add the contents of shifter 125 and latch 88. The contents of shifter 125 is the previous partial product output shifted by six bits to the right. The contents of latch 88 is the previous output of multiplier 87 formed during the second clock phase of cycle two. Concurrently, the contents of latch 108 are loaded into latch 126. The control signals required to implement this operation are also shown in FIG. 3B.

During a second phase of repeat clock cycle one, multiplier 87 multiplies a recoded four bits (two thru "minus one") of a new operand Y by operand X and stores the result in latch 88. The "minus one" bit is an inserted zero added to the right of the LSB of operand Y. Latch 114 is reset to zero by a Reset signal. Multiplier 106 multiplies another four bits, (5-2), of operand Y by a three-bit shifted value of the X operand to implement a recoded operand value (±4X, ±3X, ±2X or ±X) and stores the result in latch 108. To complete the first multiplication operation, adder 110 functions to add the contents of latch 97 coupled to adder 110 via multiplexor 127 and latch 126. An output sum is coupled to latch 116 via latch 112. Again, the control signals required to implement this operation are shown in FIG. 3B. The output product is provided via driver circuit 118. Therefore, a product of a twenty-four bit Y operand which is recoded and an eighteen bit X operand has been formed utilizing further modified Booth's algorithm. Latch 116 may be implemented to store either all output product bits which are generated to maintain full resolution of the output product or to store only a predetermined number of output product bits. When all bits are stored, a predetermined number of output product bits are generated and stored by latch 116 at the conclusion of each clock cycle. In one form, the function of latch 116 may be implemented by a plurality of parallel-connected latch circuits to avoid truncating output product bits.

By now it should be apparent that there has been provided a multiple purpose data processor which was optimized to perform LMS algorithm filtering functions as described in U.S. patent application Ser. No. 07/283,101. In addition, without adding new multiplier and adder circuitry, the present invention utilizes the same hardware to perform general purpose multiplications as a two's complement multiplier. Filtering functions adapted for a U-interface transceiver as defined by ANSI may be implemented in addition to a general purpose multiplier with the same hardware structure. The filter processor may implement the LMS algorithm in an N tap digital filter in (N+1) time cycles, where N is an integer. Examples of the LMS algorithm calculations include linear echo cancellation (LEC), decision feedback equalization (DFE) and adaptive reference compensation (ARC). The present invention operates efficiently in a pipelined manner and significantly reduces the amount of circuitry previously required to implement a variety of data processing functions. Although adaptive filtering has been discussed exclusively herein, it should also be understood that the present invention may be implemented for processing calculations associated with nonadaptive filtering.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A data processor with time multiplexed circuitry capable of selectively implementing an adaptive least mean squares (LMS) algorithm to perform a predetermined filter function and implementing a general multiplication function of two input operands, comprising:

first means comprising a first recoder having an input and an output, a first multiplier having an input coupled to the output of the first recoder, and a first adder having first and second inputs respectively coupled to the first multiplier and the first recoder, said first means selectively implementing either a first portion of the filter function or a first portion of the general multiplication function;

second means coupled to the first means comprising a second recoder having an input and an output, a second multiplier having an input coupled to the output of the second recoder, and a second adder having first and second inputs respectively coupled to the second multiplier and the second recoder, said second means selectively implementing either a second portion of the filter function or a second portion of the general multiplication function;

storage means coupled to the inputs of the first and second recoders of the first and second means, respectively, for selectively providing operands to the first and second means required to implement the predetermined filter function, the first means, second means and storage means having control inputs for receiving control signals for controlling the time multiplexed circuitry performing digital filtering and general multiplication functions.

2. The data processor of claim 1 wherein said first and second recoders recode either groups of four or more bits of an input operand to implement further modified Booth's algorithm, groups of three bits of the input operand to implement modified Booth's algorithm or groups of two bits of the input operand to implement Booth's algorithm.

3. A data processing system using time multiplexed circuitry to combine digital filtering and general multiplication unctions, said digital filtering including implementing a predetermined algorithm in an N-tap filter, where N is an integer, by calculating a convolution of a series of data values and coefficient values for the N taps and substantially concurrently performing an adaption calculation of the series of coefficient values by updating the coefficient value for each tap of the filter, said general multiplication including multiplying first and second input operands, said data processing system comprising:

update means comprising a first multiplier having an output coupled to a first input of a first adder for performing a predetermined number of update calculations to the coefficient values required to implement the predetermined algorithm, said update means also selectively providing a first plurality of recoded operands associated with the general multiplication at an output of the first multiplier and providing partial products at an output of the first adder;

convolution means comprising a second multiplier having an output coupled to a first input of a second adder, the second adder having a second input coupled to a second input of the first adder of the update means for summing a predetermined number of convolution products, each formed by multiplying a predetermined coefficient value and a predetermined data value, to provide an output signal which represents the convolution, said second multiplier also selectively providing a second plurality of recoded operands associated with the general multiplication at the output of the second multiplier and providing partial products at an output of the second adder, said second adder selectively providing an output product of the general multiplication;

storage means coupled to an input of each of the first and second multipliers of the update means and the convolution means, respectively, for selectively providing the data values and coefficient values required by both the update means and convolution means to implement the predetermined algorithm, the first means, second means and storage means having control inputs for receiving control signals for controlling the time multiplexed circuitry performing digital filtering and general multiplication functions.

4. The data processing system of claim 3 wherein said predetermined algorithm is the least-mean-squares algorithm.

5. The data processing system of claim 3 wherein the first and second plurality of recoded operands are operands recoded either by grouping four or more bits to implement further modified Booth's algorithm, by grouping three bits to implement modified Booth's algorithm or by grouping two bits to implement Booth's algorithm.

6. A method of implementing a general purpose multiplier and implementing a special function circuit for calculating a predetermined algorithm in a pipelined processor with time multiplexed circuitry, the processor performing an N-tap filter function, N being an integer, by calculating a convolution of a series of data values and coefficient values for the N taps and substantially concurrently performing an adaption calculation of the series of coefficient values by updating the coefficient value for each tap of the filter, comprising the steps of:

time multiplexing a first circuit means of the processor to perform either a predetermined number of update calculations necessary to implement the predetermined algorithm or a predetermined number of partial product calculations to implement the general purpose multiplier;

coupling a second circuit means to the first circuit means;

time multiplexing the second circuit means to perform either a predetermined number of convolution products, a final convolution product representing a completed calculation of the predetermined algorithm or an accumulation of partial product calculations representing an output product of the general purpose multiplier;

coupling a single storage means to both the first and second circuit means to provide data values and coefficient values required by both the first and second circuit means to implement the predetermined algorithm; and coupling control signals to the first circuit means, second circuit means and the single storage means to control the time multiplexed circuitry.

7. The method of claim 6 wherein the predetermined algorithm is a least-mean-squares (LMS) algorithm.

* * * * *